United States Patent [19]

Ju

[11] Patent Number: 5,640,353
[45] Date of Patent: Jun. 17, 1997

[54] EXTERNAL COMPENSATION APPARATUS AND METHOD FOR FAIL BIT DYNAMIC RANDOM ACCESS MEMORY

[75] Inventor: Jiang-Tsuen Ju, Hsinchu, Taiwan

[73] Assignee: ACT Corporation, Taiwan, Taiwan

[21] Appl. No.: 579,253

[22] Filed: Dec. 27, 1995

[51] Int. Cl.$^6$ ............................................. G11C 7/00
[52] U.S. Cl. ............................ 365/200; 365/189.07
[58] Field of Search ............................. 365/200, 189.07

[56] References Cited

U.S. PATENT DOCUMENTS

| | | | |
|---|---|---|---|
| 4,757,474 | 7/1988 | Fukushi et al. | 365/189.07 |
| 4,803,656 | 2/1989 | Takemae | 365/200 |
| 5,195,057 | 3/1993 | Kasa et al. | 365/200 |

*Primary Examiner*—Son T. Dinh
*Attorney, Agent, or Firm*—Seed and Berry LLP

[57] ABSTRACT

An apparatus and method for bit defect compensation is disclosed which comprises a tag address means for storing addresses of defective bits of a DRAM; a compensation data means for storing replacing bits utilized to replace the defective bits; a control circuit that provides logic and timing controls for compensation actions; and a comparator that provides comparison function between DRAM access address and addresses stored in the tag address means, and generates a compensation address to access the replacing bits in the compensation data means when necessary. The present invention provides an improved apparatus and method for compensating for the problem of bit defect, and improving the traditional fail bit memory scheme.

13 Claims, 7 Drawing Sheets

NON-PAGE WRITE HIT CYCLE

FIG.4

NON-PAGE READ HIT CYCLE

EXTERNAL COMPENSATION APPARATUS AND METHOD FOR FAIL BIT DYNAMIC RANDOM ACCESS MEMORY

BACKGROUND OF THE INVENTION

1. Field of the Invention

The present invention relates to a memory, system, and more particularly to an apparatus and method for using a partially functional dynamic random access memory (DRAM) on a system board to compensate for the problem of bit defect, to improve the traditional fail bit memory scheme, to simplify the mapping between external address and fail bit address, and to provide a way to adapt the memory system for changing situation, such as memory device aging or abnormality.

2. Description of the Prior Art

Memory device is one of the most important devices used in digital electronic systems such as computers and peripherals. While the speed of central processing unit(CPU) increases continuously and the function of system becomes more complicated, there demands a memory device with high density. Unfortunately as the density of memory device increases, bit defect due to the limit of fabrication process in the semiconductor industry will render the memory device useless.

A number of techniques have been designed to compensate for the problem of bit defect. One of the well-known techniques in the prior art is redundancy scheme, which provides extra rows and columns on chip to replace defective bits in rows or columns. There is an inherent limitation that a redundant row/column can only replace a defective row/column or a single bit. At the worst, there will run short of extra rows and columns to replace all of the defective bits when those defective bits are distributed widely.

Figure 1:
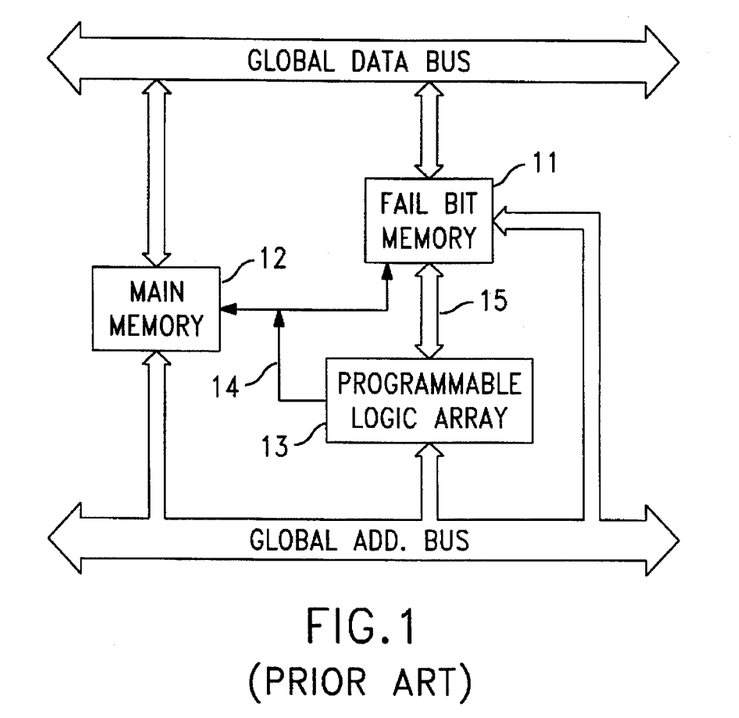
FIG. 1 is a block diagram illustrating a fail bit memory system in the prior art.

Another scheme as shown in FIG. 1 in the prior art is disclosed in U.S. Pat. No. 5,270,974 "Monolithic Fail Bit Memory" by Reddy, who adds a fail bit memory 11 to each main memory 12 chip and the defective bits in the main memory are replaced by bits in the fail bit memory using a programmable logic array(PLA) 13. If there is a match between the external address and an internal location in the PLA 13, the PLA outputs a flag 14 and a fail bit address 15 which are used to disable the main array 12 access and to enable access to the fail bit memory 11.

The fail bit memory scheme described above could be utilized preferably in chip level to overcome the disadvantage of the redundancy scheme, but has some drawbacks when practicing in board level, although the inventor suggests that the scheme could be expanded for use to create a fully functional memory board using partially functional memory chips. The first difficulty when practicing in board level is the complicated mapping method, which translates an external address to a fail bit address to access the fail bit memory 11, and the mapping is implemented by fusing the PLA 13 permanently, making it difficult to change the contents of the PLA later on; secondly the fail bit memory 11 is accessed directly through a global address containing row address and column address which demand additionally a decode logic to combine the two address when the fail bit memory is other than a dynamic RAM(DRAM); lastly defective bits could be introduced in any stage after the chip is completed such as in package process, in stress burn-in test, or due to device aging. The method based on the fail bit memory scheme described above could not be adapted for any later fail bit change, because there lacks a method and means to modify the contents of the fail bit memory 11 and the PLA 13.

SUMMARY OF THE INVENTION

It is therefore a primary object of this invention to provide an improved apparatus and method for using a partially functional dynamic random access memory(DRAM) on a system board to compensate for the problem of bit defect.

It is another object of the invention to provide an improved apparatus and method for simplifying the mapping between external address and the fail bit address.

It is a further object of the invention to provide a way to adapt the memory system for updating any defective bit later found due to memory device aging or abnormality.

Accordingly, the present invention provides an apparatus and method for bit defect compensation, which comprises a tag address region implemented by a read only memory (ROM) or electrically erasable programmable ROM (EEPROM) for storing addresses of defective bits of a DRAM; a compensation data region implemented by a memory for storing replacing bits utilized to replace the defective bits; a control circuit, which provides logic and timing controls for compensation actions; and a comparator, which provides comparison function between DRAM access address and addresses stored in the tag address region, and generates a compensation address to access the replacing bits in the compensation data region when necessary.

DESCRIPTION OF THE PREFERRED EMBODIMENT

Figure 2:
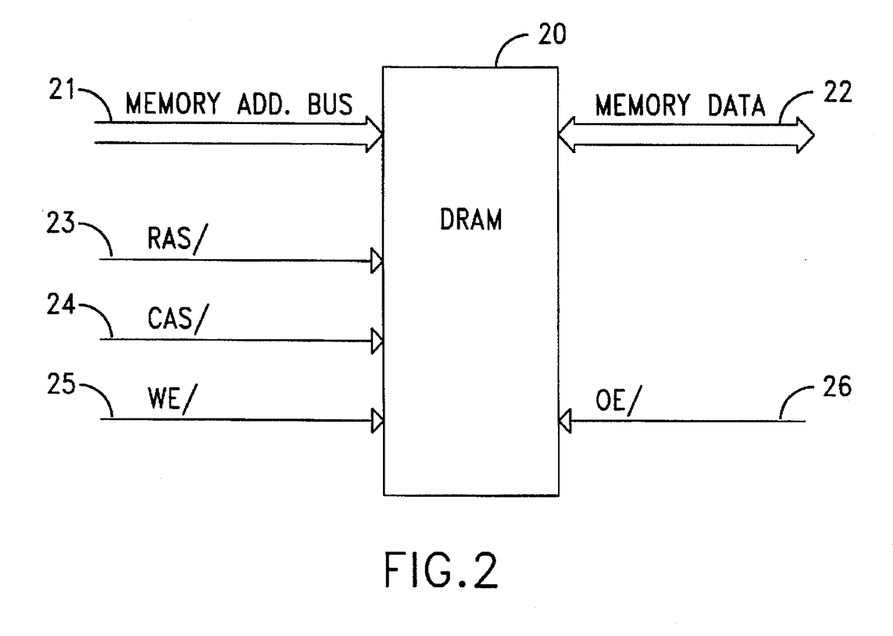
FIG. 2 is a block diagram illustrating a typical dynamic random access memory(DRAM).

FIG. 2 shows a typical dynamic random access memory (DRAM) 20, which is connected to the rest of a digital electronic system through a memory address bus 21 and a memory, data bus 22. The memory address is typically divided into two parts, a row address and a column address, which are fed to the DRAM sequentially in order to save pins of DRAM and simplify the layout of the memory system board. Two associated control signals, a row address strobe(RAS/) 23 and a column address strobe(CAS/) 24, from CPU are utilized to input the row address and the column address timely. When the write enable(WE/) 25 from CPU is asserted low, data is flowing inwards, otherwise when the state of the (WE/) 25 is high, data is flowing outwards with an active control signal, output enable(OE/) 26, which controls the output port of the DRAM.

Figure 3:
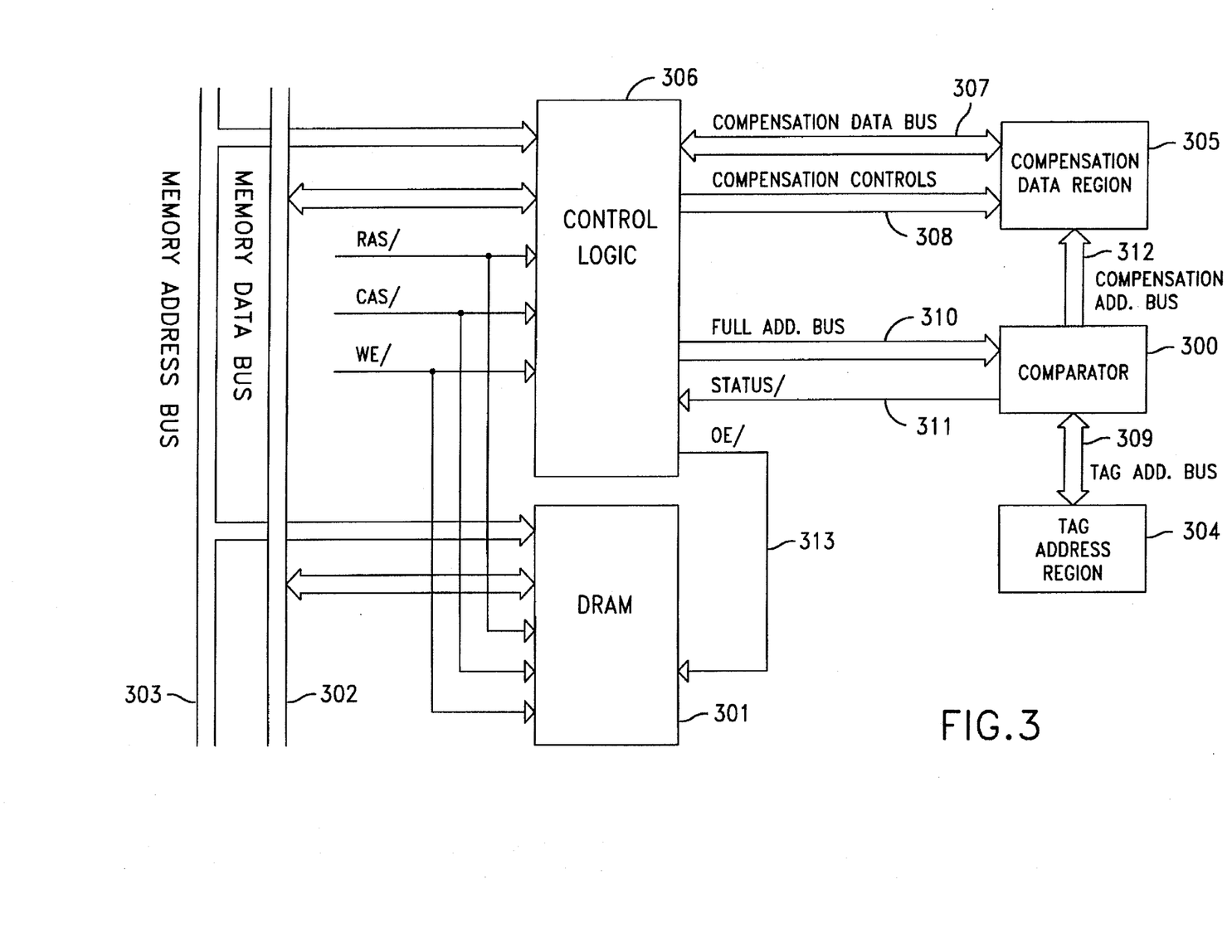
FIG. 3 is a block diagram illustrating the present invention.

FIG. 3 shows a block diagram illustrating the present invention, an apparatus for using a partially functional DRAM 301 on a system board to compensate externally for the problem of bit defect or fail bit. The compensation circuit of the present invention is connected to external memory data bus 302 and memory address bus 303 in parallel with a defective DRAM 301. It comprises of a tag address region 304 implemented by, for example, a read only memory (ROM), for storing addresses of defective bits of the DRAM; a compensation data region 305 implemented by, for example, a static random access memory(SRAM), for storing replacing bits utilized to replace the defective bits; a control circuit 306 for receiving external address through memory address bus 303, transmitting and receiving(or transceiving) external data through a memory data bus 302, transceiving compensation data through a compensation data bus 307 by the compensation control signals 308, and generating an output enable signal(OE/) 313 to control the output port of the DRAM 301; and a comparator 300 for comparing a tag address, which is fed from the tag address region 304 via tag address bus 309, and a full address, which is fed from the control circuit 306 via full address bus 310, and then generating a compensation address and a status signal(status/) 311 in accordance with the result of the comparison.

Figure 4:
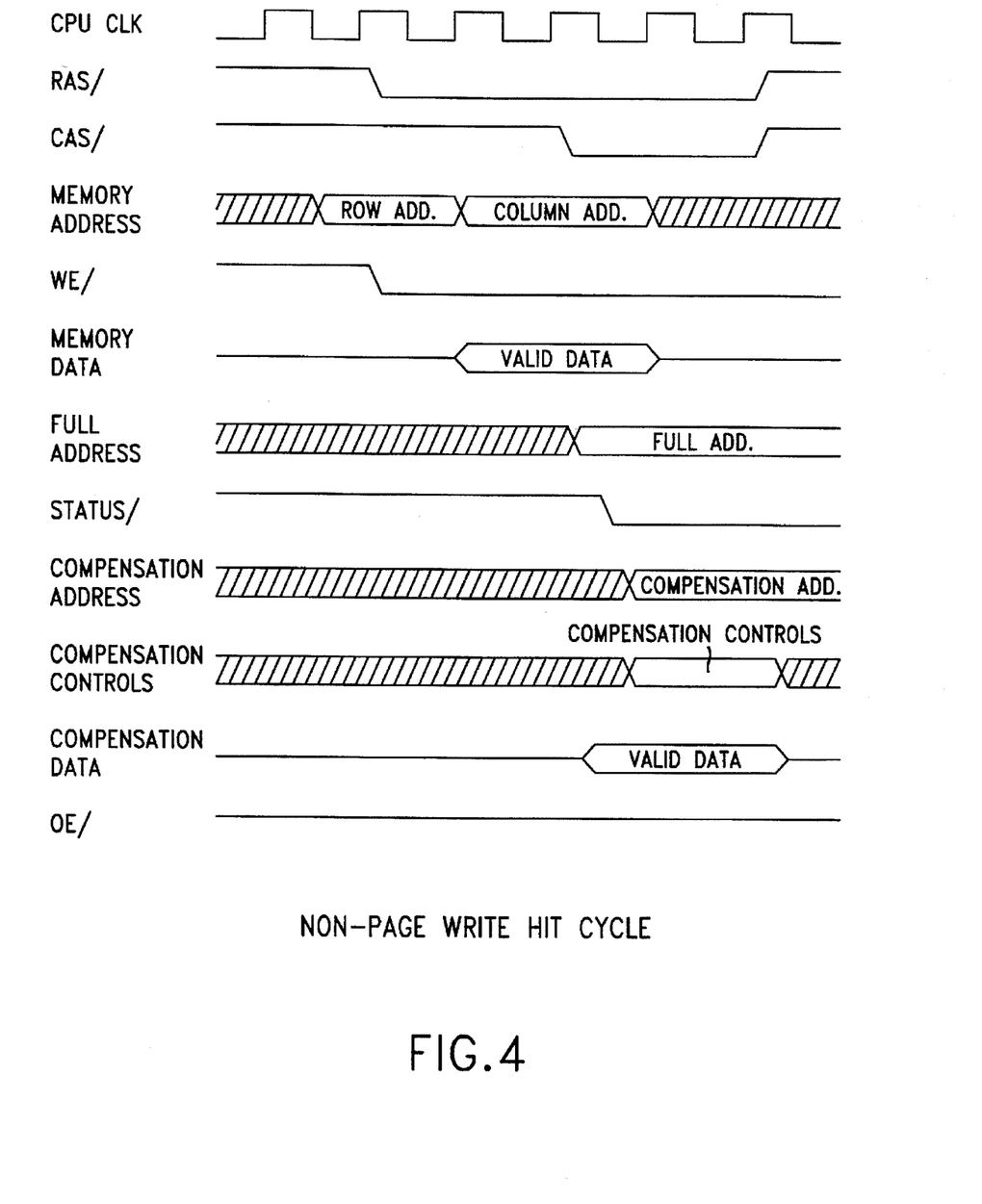
FIG. 4 is a timing diagram illustrating a non-page mode writing cycle.
Figure 5:
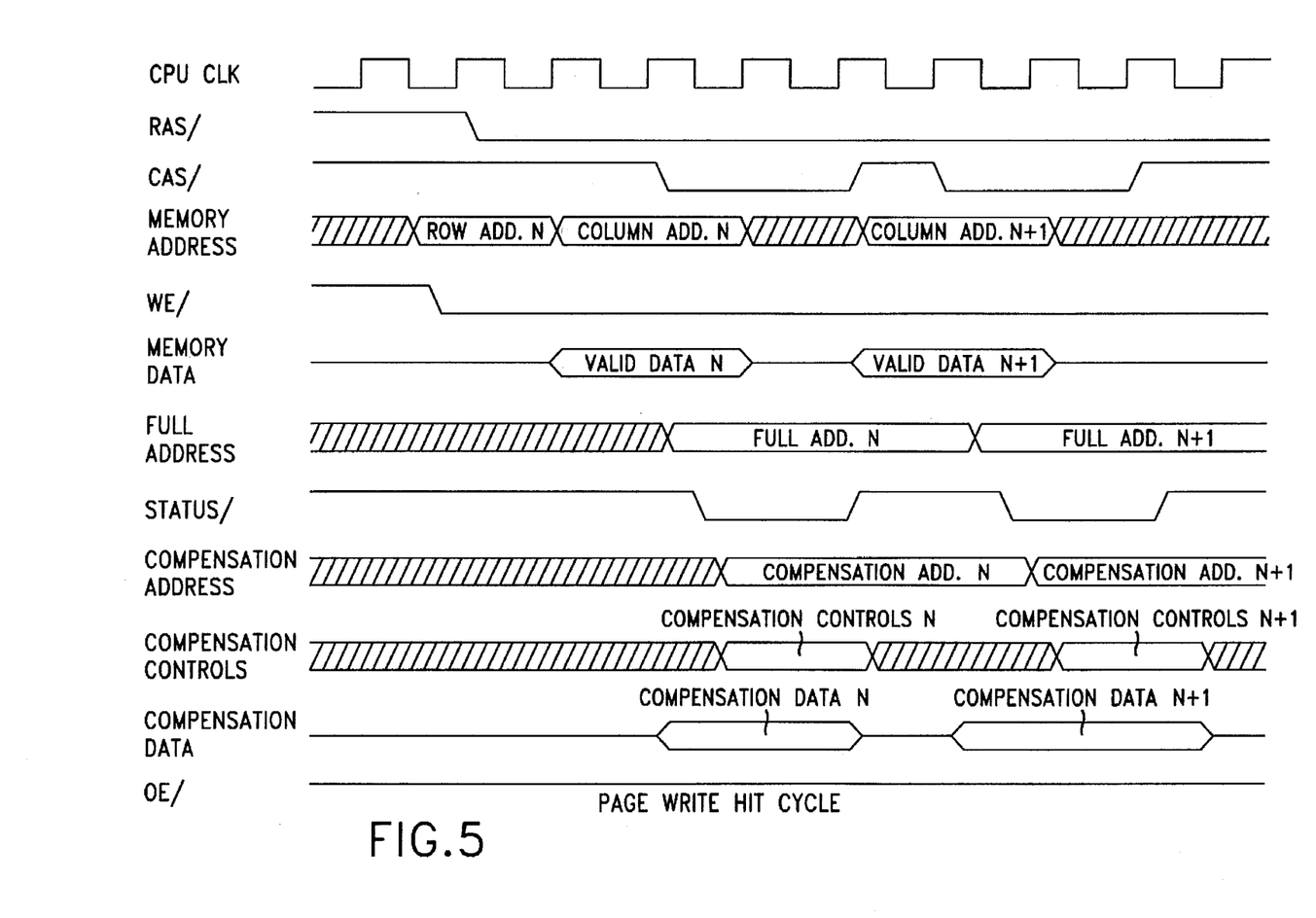
FIG. 5 is a timing diagram illustrating a page mode writing cycle.

During a write cycle, the control circuit 306 combines both incoming row address and column address into a full address, feeding this full address into the comparator 300, which compares the full address and the stored address of the defective bit. If a match occurs, a compensation address is generated by the comparator to the compensation data region 305 through a compensation address bus 312 in order to access the current replacing bit stored in the compensation data region 305, and a status signal (status/) 311 is generated to the control circuit to indicate that the current bit in the DRAM addressed by external memory address is defective. Accordingly, the data is written to the compensation data region 305 via the control circuit 306. On the other hand, while the comparison does not match, data is written to the DRAM normally. FIGS. 4 and 5 illustrate the timing diagrams for a comparison match in nonpage mode and page mode respectively.

Figure 6:
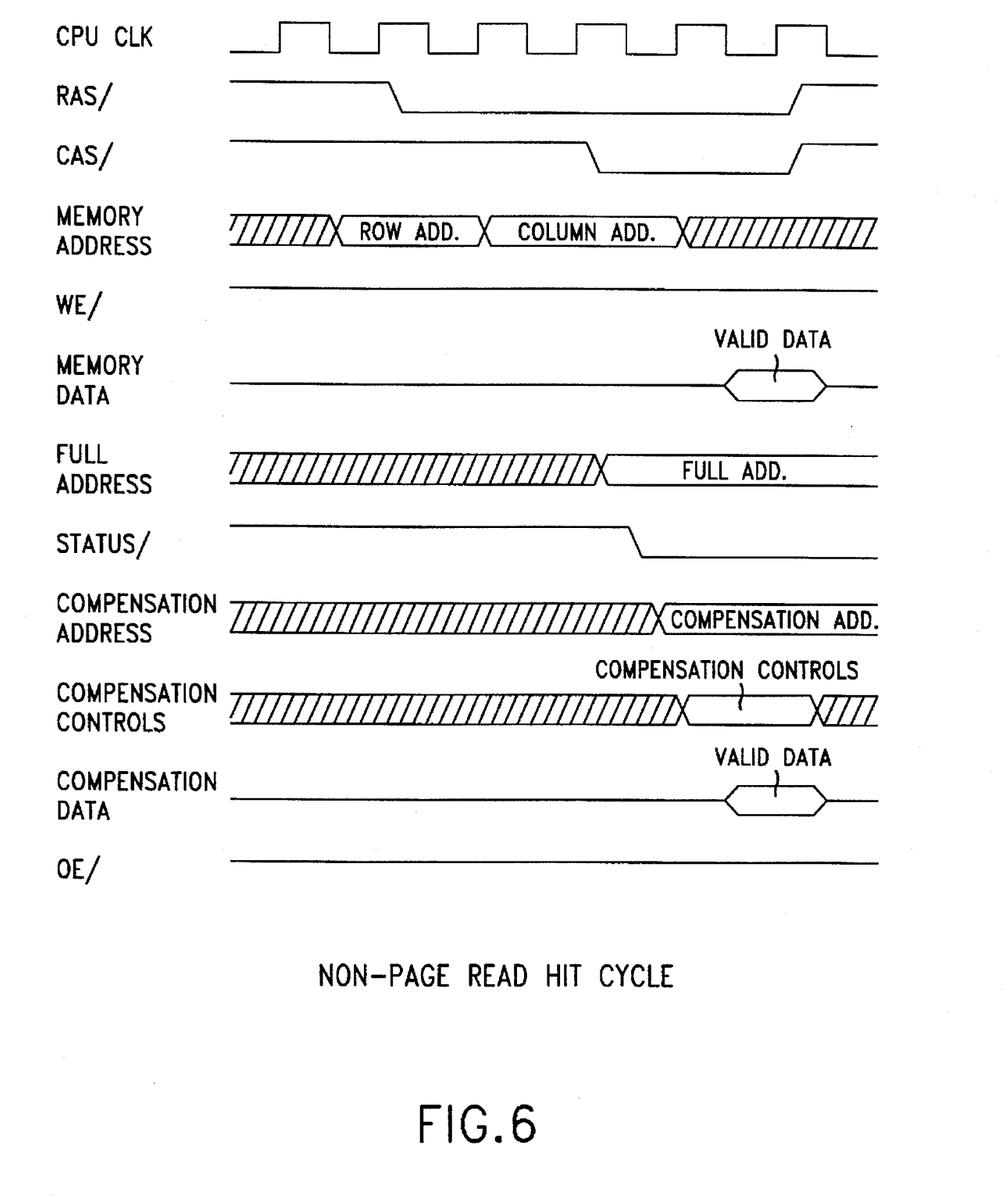
FIG. 6 is a timing diagram illustrating a non-page mode reading cycle.
Figure 7:
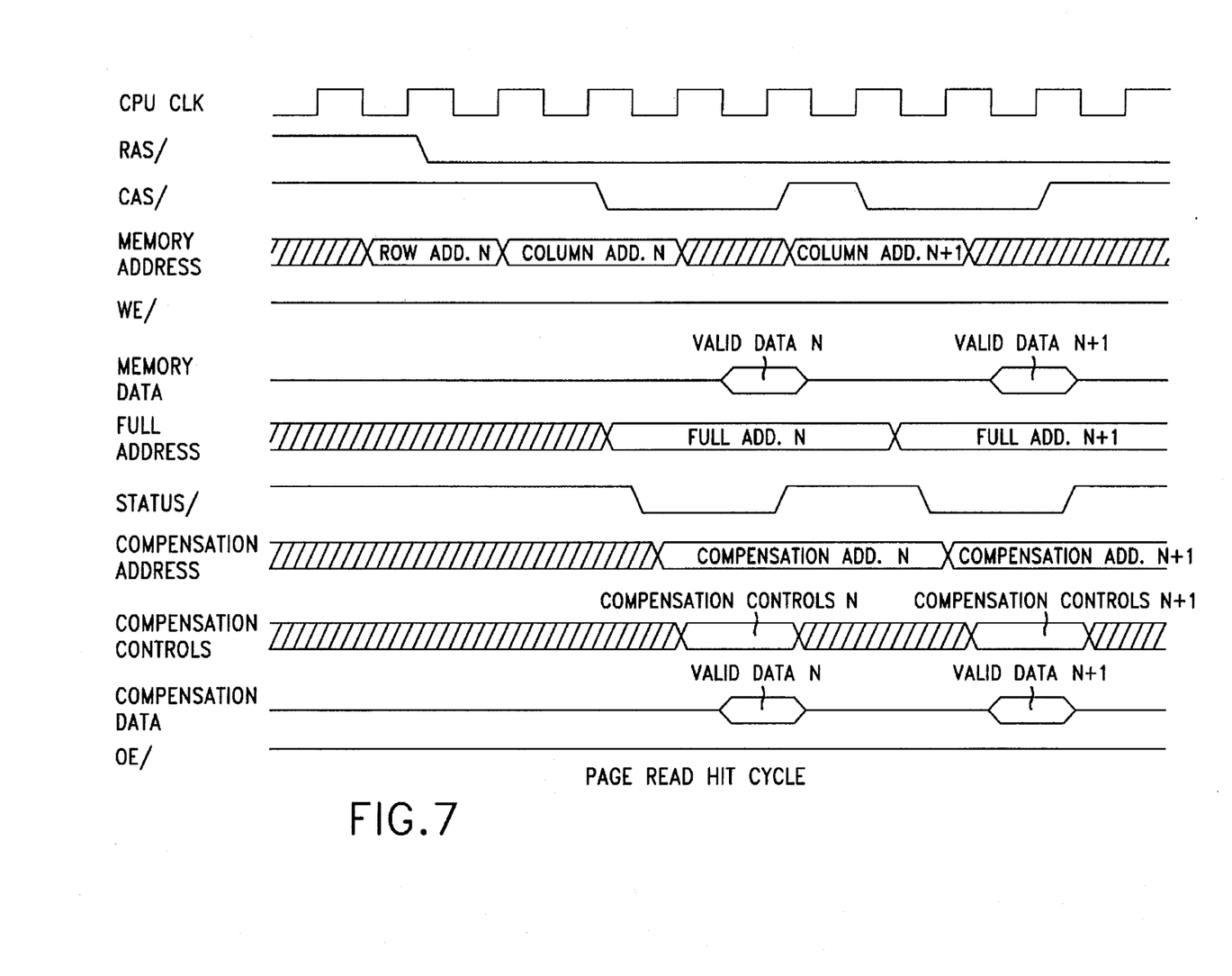
FIG. 7 is a timing diagram illustrating a page mode reading cycle.

Similarly, during a read cycle, all steps described hereinabove are the same except the directions of data flow in the compensation data bus 307 and memory data bus 302 are reversed. Besides, an output enable signal (OE/) 313 is generated to control the output port of the DRAM 301, i.e., the OE/313 is asserted low to let the data being read out while no defective bit found, and the OE/313 stays high otherwise. FIGS. 6 and 7 illustrate the timing diagrams for a comparison match in non-page mode and page mode respectively.

Figure 8:
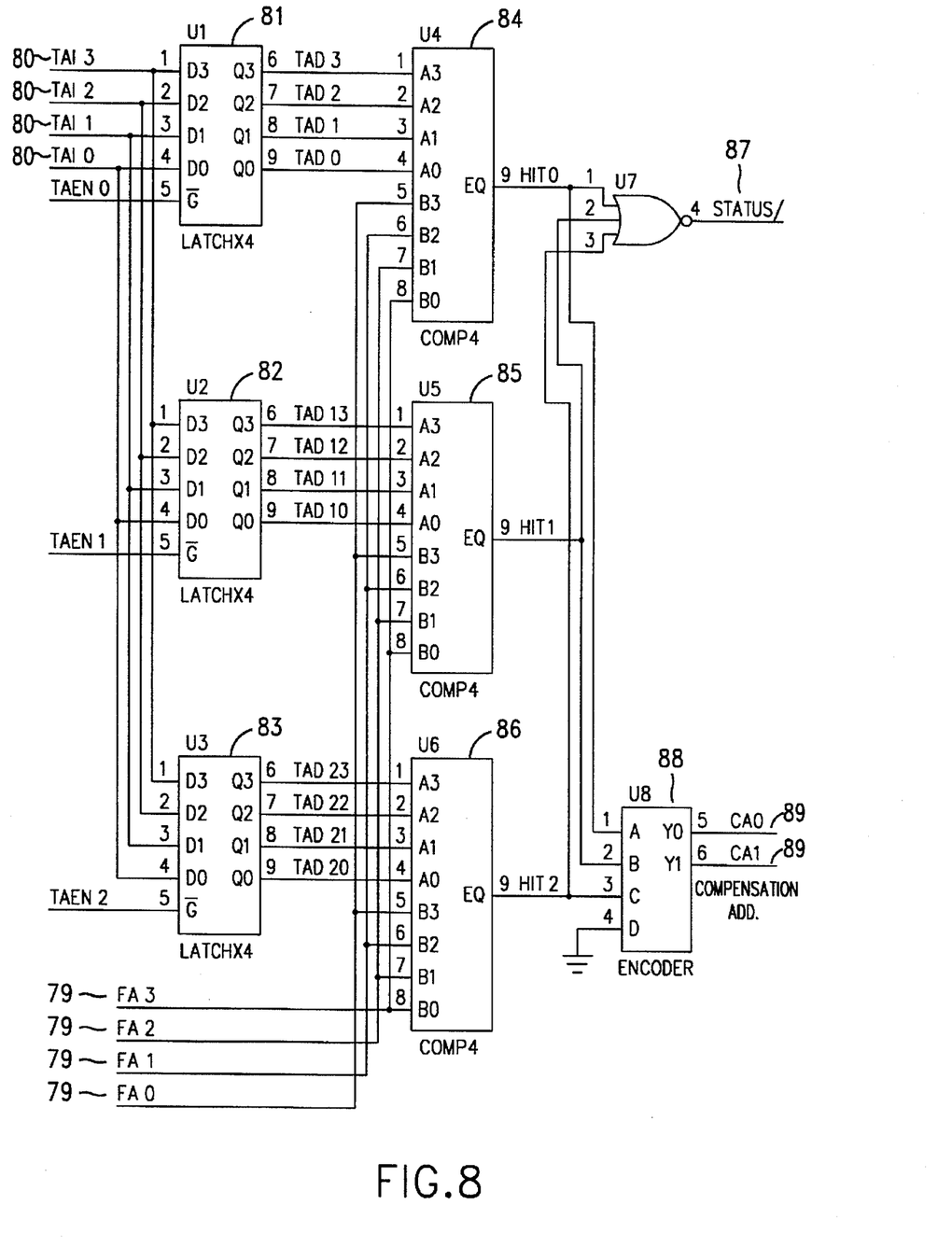
FIG. 8 is a logic diagram illustrating the comparator of the present invention.

FIG. 8 shows a logic diagram, which implements the comparator in the present invention assuming the DRAM uses 4-bit address(i.e. 16 memory locations), and 3 out of the 16 locations are defective. In order to access three replacing bits in the compensation data region, 2-bit compensation address is required. Three tag address TAI0~TAI3 (80) are latched by latch 81, latch 82 and latch 83 respectively, and are compared with the full address FA0~FA3 (79) in sub-comparator 84, sub-comparator 85 and sub-comparator 86. The results of these sub-comparators are OR-ed to generate a status/87 signal to indicate whether a match occurs, and are encoded by an encoder 88 to generate a compensation address CA0~CA1 (89).

Concerning storing the addresses of defective bits of the DRAM into the tag address region, there are two methods to implement it. First method uses a memory device, such as a read only memory(ROM) or erasable programmable ROM (EPROM), to store all the addresses of defective bits after the DRAM is packaged and tested; another method uses an electrically erasable programmable ROM(EEPROM) to store and update the addresses of defective bits immediately at any time when any defective bit is found. A method to find out defective bits is implemented by, for example, writing and reading back o's and 1's to and from DRAM by a soft-ware program, such as a BIOS. If a mismatch occurs, the current address is stored immediately into the tag address region without removing the tag address region from system board, making the present invention be adapted for any later fail bit change.

Noticeably for all the methods described above, the addresses of defective bits are stored randomly in the tag address region instead of using complicated mapping method as in the prior art.

Although specific embodiments have been illustrated and described it will be obvious to those skilled in the art that various modifications may be made without departing from the spirit which is intended to be limited solely by the appended claims.

What is claimed is:

1. Compensation apparatus for compensating bit defect of a dynamic random access memory (DRAM), wherein said apparatus is external to the DRAM, said apparatus comprising:

tag address means for storing addresses of a plurality of defective bits of the DRAM;

compensation data means for storing a plurality of replacing bits utilized to replace the defective bits of the DRAM;

a control circuit for receiving external addresses through a memory address bus, transceiving external data through a memory data bus, transceiving compensation data through a compensation data bus, and generating an output enable signal to control the output port of the DRAM;

a comparator for comparing the address of the defective bit from the tag address means via tag address bus and a full address from the control circuit via a full address bus, and generating a compensation address and a status signal in accordance with the result of the comparison.

2. The apparatus according to claim 1, wherein said tag address means is a memory.

3. The apparatus according to claim 2, wherein said memory is a read only memory (ROM).

4. The apparatus according to claim 1, wherein said compensation data means is a memory.

5. A method of external compensation for a fail-bit dynamic random access memory(DRAM), comprising the steps of:

storing a plurality of addresses of defective bits of the DRAM into a tag address means, said tag address means being external to the DRAM;

combining a row address and a column address into a full address by a control circuit and then the full address is fed to a comparator, said control circuit and said comparator being external to the DRAM;

comparing the full address and the addresses of the defective bits by the comparator and then, if a match occurs, a compensation address is generated by the comparator to a compensation data means and a status signal is generated to the control circuit, and if no match occurs, skip to the next step, said compensation data means being external to the DRAM;

in a read cycle,
  i) if the comparison is not matched, generating an output enable signal by the control circuit to enable the output port of the DRAM;
  ii) if the comparison is matched, reading data from the compensation data means via the control circuit to an external memory data bus;

in a write cycle,
  i) if the comparison is not matched, writing the data to the DRAM from the external memory data bus;
  ii) if the comparison is matched, writing the data to the compensation data means via the control circuit from the external memory data bus.

6. The compensation method according to claim 5, wherein said tag address means is a memory for storing the addresses of the defective bits of the DRAM.

7. The compensation method according to claim 6, wherein said memory is a read only memory (ROM).

8. The compensation method according to claim 6, wherein said memory is an electrically erasable programmable read only memory.

9. The compensation method according to claim 5, wherein said compensation data means is a memory for storing a plurality of replacing bits utilized to replace the defective bits of the DRAM.

10. Compensation apparatus for compensating bit defect of a dynamic random access memory (DRAM), wherein said apparatus is external to the DRAM, said apparatus comprising:

tag address means for storing addresses of a plurality of defective bits of the DRAM;

compensation data means for storing a plurality of replacing bits utilized to replace the defective bits of the DRAM;

a control circuit for receiving external addresses through a memory address bus, transceiving external data through a memory data bus, transceiving compensation data through a compensation data bus, and generating an output enable signal to control the output port of the DRAM;

a comparator for comparing the address of the defective bit from the tag address means via tag address bus and a full address from the control circuit via a full address bus, and generating a compensation address and a status signal in accordance with the result of the comparison, said full address being generated from a column address and a row address both from the memory address bus.

11. The apparatus according to claim 10, wherein said tag address means is a memory.

12. The apparatus according to claim 11, wherein said memory is a read only memory (ROM).

13. The apparatus according to claim 10, wherein said compensation data means is a memory.

* * * * *